United States Patent
Khlat

(10) Patent No.: US 12,101,063 B2
(45) Date of Patent: Sep. 24, 2024

(54) DISTRIBUTED POWER MANAGEMENT APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 420 days.

(21) Appl. No.: 17/404,587

(22) Filed: Aug. 17, 2021

(65) Prior Publication Data

US 2022/0271714 A1    Aug. 25, 2022

Related U.S. Application Data

(60) Provisional application No. 63/151,257, filed on Feb. 19, 2021.

(51) Int. Cl.
*H03F 3/04* (2006.01)
*H03F 1/02* (2006.01)
(Continued)

(52) U.S. Cl.
CPC ........... *H03F 1/0222* (2013.01); *H03F 3/195* (2013.01); *H03F 3/245* (2013.01); *H03F 2200/102* (2013.01); *H03F 2200/451* (2013.01)

(58) Field of Classification Search
CPC ........ H03F 1/0222; H03F 3/195; H03F 3/245; H03F 2200/102; H03F 2200/451;
(Continued)

(56) References Cited

U.S. PATENT DOCUMENTS 6,529,716 B1    3/2003    Eidson et al.
6,788,151 B2    9/2004    Shvarts et al.
(Continued)

FOREIGN PATENT DOCUMENTS

EP    3644500 A1    4/2020
WO    2018182778 A1    10/2018

OTHER PUBLICATIONS

Notice of Allowance for U.S. Appl. No. 17/408,651, mailed Jun. 23, 2023, 8 pages.
(Continued)

*Primary Examiner* — Khanh V Nguyen
(74) *Attorney, Agent, or Firm* — Withrow & Terranova, P.L.L.C.

(57) ABSTRACT

A distributed power management apparatus is provided. The distributed power management apparatus includes an envelope tracking (ET) integrated circuit (ETIC) and a distributed ETIC separated from the ETIC. The ETIC is configured to generate a number of ET voltages for a number of power amplifier circuits and the distributed ETIC is configured to generate a distributed ET voltage(s) for a distributed power amplifier circuit(s). In a non-limiting example, the number of power amplifier circuits and the distributed power amplifier circuit(s) can be disposed on opposite sides (e.g., top and bottom) of a wireless device. As such, in embodiments disclosed herein, the ETIC is provided closer to the power amplifier circuits and the distributed ETIC is provided closer to the distributed power amplifier circuit(s). By providing the ETIC and the distributed ETIC closer to the respective power amplifier circuits, it is possible to reduce trace inductance and unwanted signal distortion.

20 Claims, 4 Drawing Sheets

(51) Int. Cl.
    *H03F 3/195*     (2006.01)
    *H03F 3/24*     (2006.01)
    *H03G 3/20*     (2006.01)

(58) Field of Classification Search
    CPC . H03F 1/0227; H03F 1/32; H03F 1/56; H03F 3/213; H03F 3/189; H03F 3/04; H03F 1/0244; H03F 1/0211; H03F 2200/504; H01Q 1/243
    USPC .......................................................... 330/297
    See application file for complete search history.

(56) References Cited

U.S. PATENT DOCUMENTS

| | | | |
|---|---|---|---|
| 7,859,338 B2 | 12/2010 | Bajdechi et al. | |
| 8,019,289 B2 | 9/2011 | Gorbachov | |
| 8,290,453 B2 | 10/2012 | Yoshihara | |
| 8,385,859 B2 | 2/2013 | Hamano | |
| 8,476,976 B2 | 7/2013 | Wimpenny | |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,803,603 B2 | 8/2014 | Wimpenny | |
| 8,816,272 B1 | 8/2014 | Brown et al. | |
| 8,816,768 B2 | 8/2014 | Tseng et al. | |
| 8,818,305 B1 | 8/2014 | Schwent et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,065,509 B1 | 6/2015 | Yan et al. | |
| 9,197,162 B2 | 11/2015 | Chiron et al. | |
| 9,197,256 B2 | 11/2015 | Khlat | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,277,501 B2 | 3/2016 | Lorenz et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,356,760 B2 | 5/2016 | Larsson et al. | |
| 9,374,005 B2 | 6/2016 | Rozek et al. | |
| 9,379,667 B2 | 6/2016 | Khlat et al. | |
| 9,438,172 B2 | 9/2016 | Cohen | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,560,595 B2 | 1/2017 | Dakshinamurthy et al. | |
| 9,571,152 B2 | 2/2017 | Ripley et al. | |
| 9,596,110 B2 | 3/2017 | Jiang et al. | |
| 9,614,476 B2 | 4/2017 | Khlat | |
| 9,614,477 B1 | 4/2017 | Rozenblit et al. | |
| 9,641,206 B2 | 5/2017 | Pratt et al. | |
| 9,671,801 B2 | 6/2017 | Bhattad et al. | |
| 9,743,357 B2 | 8/2017 | Tabe | |
| 9,831,834 B2 | 11/2017 | Balteanu et al. | |
| 9,831,934 B2 | 11/2017 | Kotecha et al. | |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2 | 6/2018 | Khesbak et al. | |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,145 B1 | 10/2018 | Khlat et al. | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,158,328 B2 | 12/2018 | Nobbe et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,305,429 B2 | 5/2019 | Choo et al. | |
| 10,326,408 B2 | 6/2019 | Khlat et al. | |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,557 B2 * | 10/2019 | Khlat | H03F 1/0227 |
| 10,439,789 B2 | 10/2019 | Brunel et al. | |
| 10,454,428 B2 | 10/2019 | Khesbak et al. | |
| 10,476,437 B2 * | 11/2019 | Nag | H03F 1/0216 |
| 11,088,658 B2 * | 8/2021 | Khlat | H03F 3/211 |
| 11,088,660 B2 | 8/2021 | Lin et al. | |
| 11,146,213 B2 * | 10/2021 | Khlat | H03F 1/0227 |
| 11,152,976 B2 | 10/2021 | Cho et al. | |
| 11,323,075 B2 * | 5/2022 | Khlat | H03F 1/0227 |
| 11,387,789 B2 | 7/2022 | Khlat et al. | |
| 11,424,719 B2 | 8/2022 | Khlat et al. | |
| 11,569,783 B2 | 1/2023 | Nomiyama et al. | |
| 2004/0100323 A1 | 5/2004 | Khanifer et al. | |
| 2009/0128236 A1 | 5/2009 | Wilson | |
| 2009/0253389 A1 | 10/2009 | Ma et al. | |
| 2011/0223875 A1 | 9/2011 | Hamano | |
| 2012/0142304 A1 | 6/2012 | Degani et al. | |
| 2012/0146731 A1 | 6/2012 | Khesbak | |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0057684 A1 | 2/2014 | Khlat | |
| 2014/0111279 A1 | 4/2014 | Brobston | |
| 2014/0218109 A1 | 8/2014 | Wimpenny | |
| 2014/0273897 A1 | 9/2014 | Drogi et al. | |
| 2014/0306763 A1 | 10/2014 | Hong et al. | |
| 2014/0306769 A1 | 10/2014 | Khlat et al. | |
| 2014/0315504 A1 | 10/2014 | Sakai et al. | |
| 2014/0354251 A1 | 12/2014 | Williams | |
| 2014/0361837 A1 | 12/2014 | Strange et al. | |
| 2015/0009980 A1 | 1/2015 | Modi et al. | |
| 2015/0091645 A1 | 4/2015 | Park et al. | |
| 2015/0123628 A1 | 5/2015 | Bhattad et al. | |
| 2015/0194988 A1 | 7/2015 | Yan et al. | |
| 2015/0236729 A1 | 8/2015 | Peng et al. | |
| 2016/0036389 A1 | 2/2016 | Balteanu et al. | |
| 2016/0050629 A1 | 2/2016 | Khesbak et al. | |
| 2016/0094185 A1 | 3/2016 | Shute | |
| 2016/0094186 A1 | 3/2016 | Cohen | |
| 2016/0099686 A1 | 4/2016 | Perreault et al. | |
| 2016/0105151 A1 | 4/2016 | Langer | |
| 2016/0181995 A1 | 6/2016 | Nentwig et al. | |
| 2016/0204809 A1 | 7/2016 | Pratt et al. | |
| 2016/0226448 A1 | 8/2016 | Wimpenny | |
| 2016/0294587 A1 | 10/2016 | Jiang et al. | |
| 2017/0070199 A1 | 3/2017 | Anderson et al. | |
| 2017/0077877 A1 | 3/2017 | Anderson | |
| 2017/0093340 A1 | 3/2017 | Khesbak | |
| 2017/0207802 A1 | 7/2017 | Pratt et al. | |
| 2017/0230924 A1 | 8/2017 | Wolberg et al. | |
| 2017/0279412 A1 | 9/2017 | Afsahi et al. | |
| 2017/0353287 A1 | 12/2017 | Onaka et al. | |
| 2018/0048276 A1 | 2/2018 | Khlat et al. | |
| 2018/0138862 A1 | 5/2018 | Balteanu et al. | |
| 2018/0138863 A1 | 5/2018 | Khlat | |
| 2018/0159476 A1 | 6/2018 | Balteanu et al. | |
| 2018/0159566 A1 | 6/2018 | Dinur et al. | |

(56) References Cited

U.S. PATENT DOCUMENTS

| | | | |
|---|---|---|---|
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222178 A1 | 7/2019 | Khlat et al. |
| 2019/0222181 A1 | 7/2019 | Khlat |
| 2019/0267947 A1 | 8/2019 | Khlat et al. |
| 2019/0356285 A1 | 11/2019 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136575 A1 | 4/2020 | Khlat et al. |
| 2020/0228063 A1 | 7/2020 | Khlat |
| 2020/0266766 A1 | 8/2020 | Khlat et al. |
| 2020/0295708 A1 | 9/2020 | Khlat |
| 2020/0295710 A1 | 9/2020 | Khlat |
| 2020/0295713 A1 | 9/2020 | Khlat |
| 2020/0343859 A1 | 10/2020 | Khlat |
| 2020/0350878 A1 | 11/2020 | Drogi et al. |
| 2020/0382061 A1 | 12/2020 | Khlat |
| 2020/0382062 A1 | 12/2020 | Khlat |
| 2020/0382074 A1 | 12/2020 | Khlat |
| 2021/0006206 A1 | 1/2021 | Khlat |
| 2021/0194517 A1 | 6/2021 | Mirea et al. |
| 2021/0384869 A1 | 12/2021 | Khlat |
| 2022/0255513 A1 | 8/2022 | Khlat |

OTHER PUBLICATIONS

Final Office Action for U.S. Appl. No. 17/942,472, mailed Jul. 19, 2023, 16 pages.
Advisory Action for U.S. Appl. No. 17/942,472, mailed Sep. 15, 2023, 3 pages.
International Preliminary Report on Patentability for International Patent Application No. PCT/US2021/052151, mailed Oct. 13, 2022, 21 pages.
Notice of Allowance for U.S. Appl. No. 17/027,963, mailed Mar. 30, 2022, 8 pages.
Extended European Search Report for European Patent Application No. 22152966.2, mailed Jun. 23, 2022, 9 pages.
Final Office Action for U.S. Appl. No. 17/027,963, mailed Jan. 14, 2022, 4 pages.
Notice of Allowance and Examiner-Initiated Interview Summary for U.S. Appl. No. 16/669,728, mailed Dec. 8, 2021, 8 pages.
International Search Report and Written Opinion for International Patent Application No. PCT/US2020/043067, mailed Nov. 11, 2020, 19 pages.
International Search Report and Written Opinion for International Patent Application No. PCT/US2021/052151, mailed Jan. 4, 2022, 16 pages.
Notice of Allowance for U.S. Appl. No. 17/942,472, mailed Oct. 18, 2023, 10 pages.
Corrected Notice of Allowability and Response to Rule 312 Communication for U.S. Appl. No. 17/942,472, mailed Nov. 17, 2023, 6 pages.
Non-Final Office Action for U.S. Appl. No. 17/408,651, mailed Mar. 2, 2023, 13 pages.
Non-Final Office Action for U.S. Appl. No. 17/942,472, mailed Feb. 16, 2023, 13 pages.
Extended European Search Report for European Patent Application No. 22195683.2, mailed Feb. 10, 2023, 12 pages.
Non-Final Office Action for U.S. Appl. No. 16/263,368, mailed Dec. 26, 2019, 6 pages.
Notice of Allowance for U.S. Appl. No. 16/273,288, mailed Dec. 13, 2019, 8 pages.
Non-Final Office Action for U.S. Appl. No. 16/263,316, mailed Dec. 23, 2019, 9 pages.
Notice of Allowance for U.S. Appl. No. 16/193,513, mailed Mar. 25, 2020, 8 pages.
Non-Final Office Action for U.S. Appl. No. 16/250,229, mailed Apr. 29, 2020, 7 pages.
Non-Final Office Action for U.S. Appl. No. 16/267,740, mailed Apr. 30, 2020, 10 pages.
Final Office Action for U.S. Appl. No. 16/263,316, mailed May 13, 2020, 10 pages.
Non-Final Office Action for U.S. Appl. No. 16/278,886, mailed Apr. 29, 2020, 9 pages.
Quayle Action for U.S. Appl. No. 16/267,779, mailed May 1, 2020, 8 pages.
Final Office Action for U.S. Appl. No. 16/263,368, mailed May 22, 2020, 9 pages.
Notice of Allowance for U.S. Appl. No. 16/250,229, mailed Sep. 22, 2020, 7 pages.
Quayle Action for U.S. Appl. No. 16/267,740, mailed Oct. 19, 2020, 7 pages.
Notice of Allowance for U.S. Appl. No. 16/267,740, mailed Mar. 3, 2021, 8 pages.
Non-Final Office Action for U.S. Appl. No. 16/263,316, mailed Jul. 17, 2020, 4 pages.
Non-Final Office Action for U.S. Appl. No. 16/263,316, mailed Nov. 24, 2020, 4 pages.
Notice of Allowance for U.S. Appl. No. 16/263,316, mailed Mar. 30, 2021, 7 pages.
Notice of Allowance for U.S. Appl. No. 16/270,119, mailed Jun. 18, 2020, 9 pages.
Non-Final Office Action for U.S. Appl. No. 17/027,963, mailed Aug. 13, 2021, 6 pages.
Notice of Allowance for U.S. Appl. No. 16/278,886, mailed Sep. 22, 2020, 8 pages.
Non-Final Office Action for U.S. Appl. No. 16/250,298, mailed Aug. 20, 2020, 8 pages.
Quayle Action for U.S. Appl. No. 16/250,298, mailed Feb. 3, 2021, 5 pages.
Notice of Allowance for U.S. Appl. No. 16/250,298, mailed Apr. 15, 2021, 8 pages.
Non-Final Office Action for U.S. Appl. No. 16/689,236, mailed Mar. 2, 2021, 15 pages.
Notice of Allowance for U.S. Appl. No. 16/689,236, mailed Jun. 9, 2021, 7 pages.
Non-Final Office Action for U.S. Appl. No. 16/263,368, mailed Aug. 7, 2020, 4 pages.
Non-Final Office Action for U.S. Appl. No. 16/263,368, mailed Dec. 17, 2020, 8 pages.
Notice of Allowance for U.S. Appl. No. 16/263,368, mailed Apr. 29, 2021, 7 pages.
Notice of Allowance for U.S. Appl. No. 16/508,704, mailed Dec. 30, 2020, 7 pages.
Notice of Allowance for U.S. Appl. No. 16/508,768, mailed Oct. 27, 2020, 9 pages.
Quayle Action for U.S. Appl. No. 16/514,339, mailed Nov. 19, 2020, 9 pages.
Non-Final Office Action for U.S. Appl. No. 16/660,900, mailed Feb. 18, 2021, 7 pages.
Notice of Allowance for U.S. Appl. No. 16/689,417, mailed Feb. 24, 2021, 7 pages.
Non-Final Office Action for U.S. Appl. No. 16/669,728, mailed Jun. 3, 2021, 9 pages.

(56) References Cited

OTHER PUBLICATIONS

Non-Final Office Action for U.S. Appl. No. 17/629,759, mailed Jul. 18, 2024, 7 pages.

* cited by examiner

DISTRIBUTED POWER MANAGEMENT APPARATUS

RELATED APPLICATIONS

This application claims the benefit of provisional patent application Ser. No. 63/151,257, filed Feb. 19, 2021, the disclosure of which is hereby incorporated herein by reference in its entirety.

FIELD OF THE DISCLOSURE

The technology of the disclosure relates generally to a distributed power management apparatus.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance to time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, the time-variant ET voltage(s) can be highly susceptible to distortions caused by trace inductance, particularly when the time-variant ET voltage(s) is so generated to track the time-variant power envelope(s) of a high modulation bandwidth (e.g., >200 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it may be necessary to ensure that the ET power amplifier(s) can consistently operate at a desired linearity for any given instantaneous power requirement of the RF signal(s).

SUMMARY

Embodiments of the disclosure relate to a distributed power management apparatus. The distributed power management apparatus includes an envelope tracking (ET) integrated circuit (ETIC) and a distributed ETIC separated from the ETIC. The ETIC is configured to generate a number of ET voltages for a number of power amplifier circuits and the distributed ETIC is configured to generate a distributed ET voltage(s) for a distributed power amplifier circuit(s). In a non-limiting example, the number of power amplifier circuits and the distributed power amplifier circuit(s) can be disposed on opposite sides (e.g., top and bottom) of a wireless device. As such, in embodiments disclosed herein, the ETIC is provided closer to the power amplifier circuits and the distributed ETIC is provided closer to the distributed power amplifier circuit(s). By providing the ETIC and the distributed ETIC closer to the respective power amplifier circuits, it is possible to reduce trace inductance and unwanted signal distortion.

In one aspect, a distributed power management apparatus is provided. The distributed power management apparatus includes a distributed ETIC. The distributed ETIC includes a distributed voltage circuit. The distributed voltage circuit is configured to generate a distributed ET voltage based on a distributed ET target voltage. The distributed power management apparatus also includes an ETIC separated from the distributed ETIC. The ETIC includes a number of voltage circuits each configured to generate a respective one of a number of ET voltages and a respective one of a number of low-frequency currents based on a respective one of a number of ET target voltages. The ETIC also includes a control circuit. The control circuit is configured to couple a selected one of the number of voltage circuits to the distributed ETIC to provide the respective one of the number of low-frequency currents to the distributed ETIC. The control circuit is also configured to cause a selected one of the number of ET target voltages to be provided to the distributed ETIC as the distributed ET target voltage.

In another aspect, a wireless device is provided. The wireless device includes a distributed power management apparatus. The distributed ETIC includes a distributed voltage circuit. The distributed voltage circuit is configured to generate a distributed ET voltage based on a distributed ET target voltage. The distributed power management apparatus also includes an ETIC separated from the distributed ETIC. The ETIC includes a number of voltage circuits each configured to generate a respective one of a number of ET voltages and a respective one of a number of low-frequency currents based on a respective one of a number of ET target voltages. The ETIC also includes a control circuit. The control circuit is configured to couple a selected one of the number of voltage circuits to the distributed ETIC to provide the respective one of the number of low-frequency currents to the distributed ETIC. The control circuit is also configured to cause a selected one of the number of ET target voltages to be provided to the distributed ETIC as the distributed ET target voltage. The wireless device also includes one or more power amplifier circuits coupled to the ETIC. The wireless device also includes at least one distributed power amplifier circuit coupled to the distributed ETIC.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
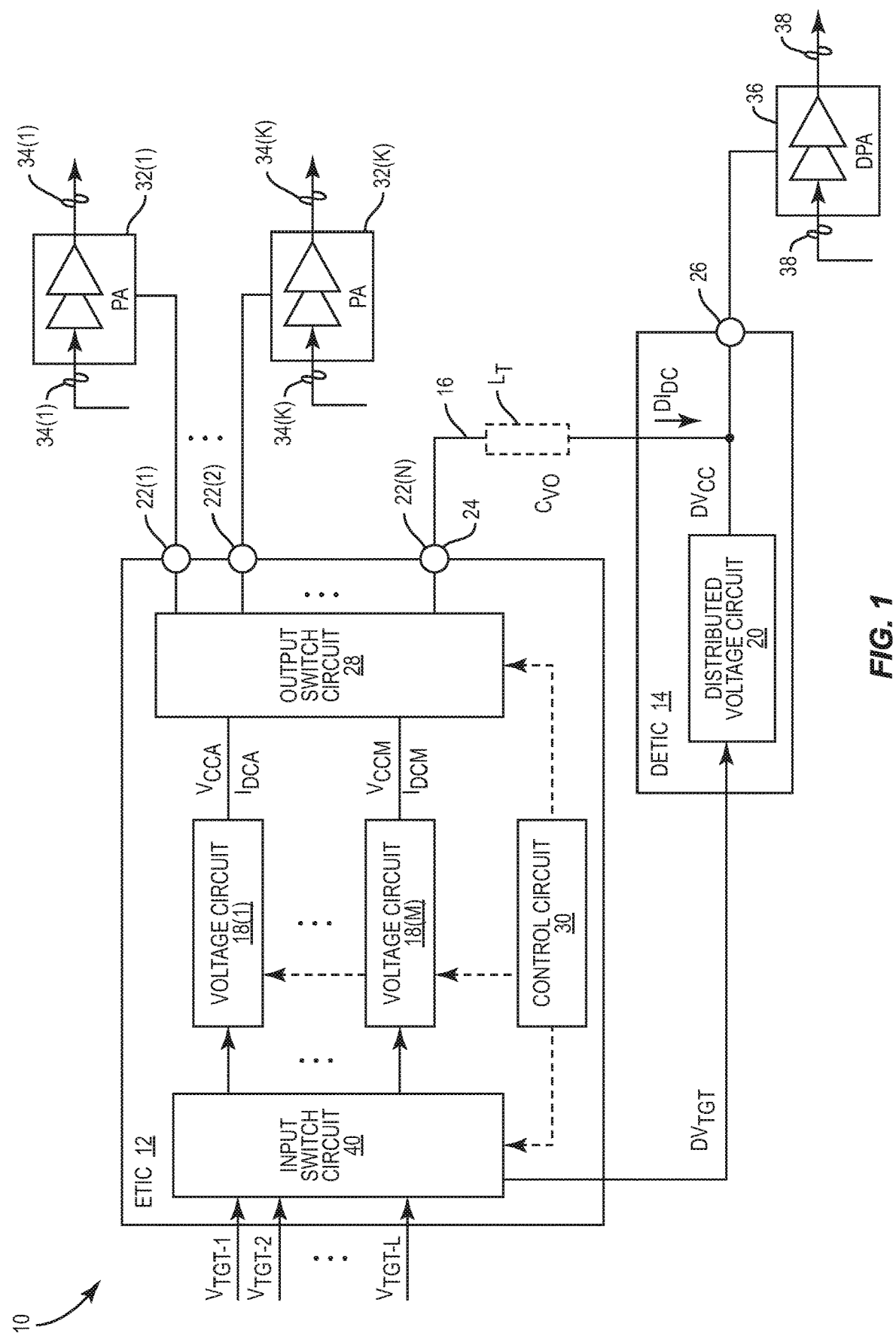
FIG. 1 is a schematic diagram of an exemplary distributed power management apparatus configured according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a distributed power management apparatus. The distributed power management apparatus includes an envelope tracking (ET) integrated circuit (ETIC) and a distributed ETIC separated from the ETIC. The ETIC is configured to generate a number of ET voltages for a number of power amplifier circuits and the distributed ETIC is configured to generate a distributed ET voltage(s) for a distributed power amplifier circuit(s). In a non-limiting example, the number of power amplifier circuits and the distributed power amplifier circuit(s) can be disposed on opposite sides (e.g., top and bottom) of a wireless device. As such, in embodiments disclosed herein, the ETIC is provided closer to the power amplifier circuits and the distributed ETIC is provided closer to the distributed power amplifier circuit(s). By providing the ETIC and the distributed ETIC closer to the respective power amplifier circuits, it is possible to reduce trace inductance and unwanted signal distortion.

FIG. 1 is a schematic diagram of an exemplary distributed power management apparatus 10 configured according to an embodiment of the present disclosure. The distributed power management apparatus 10 includes an ETIC 12 and a distributed ETIC 14 (denoted as "DETIC"). Notably, the ETIC 12 and the distributed ETIC 14 are separate circuits that are coupled by a conductive trace 16.

The ETIC 12 includes a number of voltage circuits 18(1)-18(M). Each of the voltage circuits 18(1)-18(M) can be configured to generate a respective one of a number of ET voltages $V_{CCA}$-$V_{CCM}$ and a respective one of a number of low-frequency currents $I_{DCA}$-$I_{DCM}$ (e.g., direct currents) based on a respective one of a number of ET target voltages $V_{TGT-1}$-$V_{TGT-L}$.

The distributed ETIC 14 includes at least one distributed voltage circuit 20, which is configured to generate at least one distributed ET voltage $D_{VCC}$ based on at least one distributed ET target voltage $D_{VTGT}$. Notably, the distributed voltage circuit 20 does not generate its own low-frequency current. Instead, the distributed ETIC 14 is configured to receive a respective one of the low-frequency currents $I_{CCA}$-$I_{CCM}$ generated by a selected one of the voltage circuits 18(1)-18(M) (also referred to as "a selected low-frequency current $DI_{DC}$" hereinafter) via the conductive trace 16. Further, the distributed ETIC 14 also receives a respective one of the ET target voltages $V_{TGT-1}$-$V_{TGT-L}$ of the selected one of the voltage circuits 18(1)-18(M) as the distributed ET target voltage $D_{VTGT}$. As discussed later in FIGS. 3A and 3B, the distributed ETIC 14 can have a smaller footprint than the ETIC 12 by receiving the distributed ET target voltage $D_{VTGT}$ and the selected low-frequency current $DI_{DC}$ from the ETIC 12.

The ETIC 12 can include a number of voltage outputs 22(1)-22(N). In embodiments disclosed herein, N may be smaller than, equal to, or larger than M. One of the voltage outputs 22(1)-22(N) (referred to as "a dedicated voltage output 24" hereinafter) is dedicated to providing the selected low-frequency current $DI_{DC}$ to a distributed voltage output 26 in the distributed ETIC 14. As a non-limiting example, the voltage output 22(N) is discussed hereinafter as the dedicated voltage output 24. However, it should be appreciated that any of the voltage outputs 22(1)-22(N) can be configured to function as the dedicated voltage output 24.

The ETIC 12 further includes an output switch circuit 28 configured to couple any of the voltage circuits 18(1)-18(M) to any of the voltage outputs 22(1)-22(N). The ETIC 12 further includes a control circuit 30, which can be a field-programmable gate array (FPGA), as an example. The control circuit 30 may control the output switch circuit 28 to couple any of the voltage circuits 18(1)-18(M) to the dedicated voltage output 24 to provide the respective one of the low-frequency currents $I_{DCA}$-$I_{DCM}$ to the distributed voltage output 26 as the selected low-frequency current $DI_{DC}$.

Figures 2A, 2B:
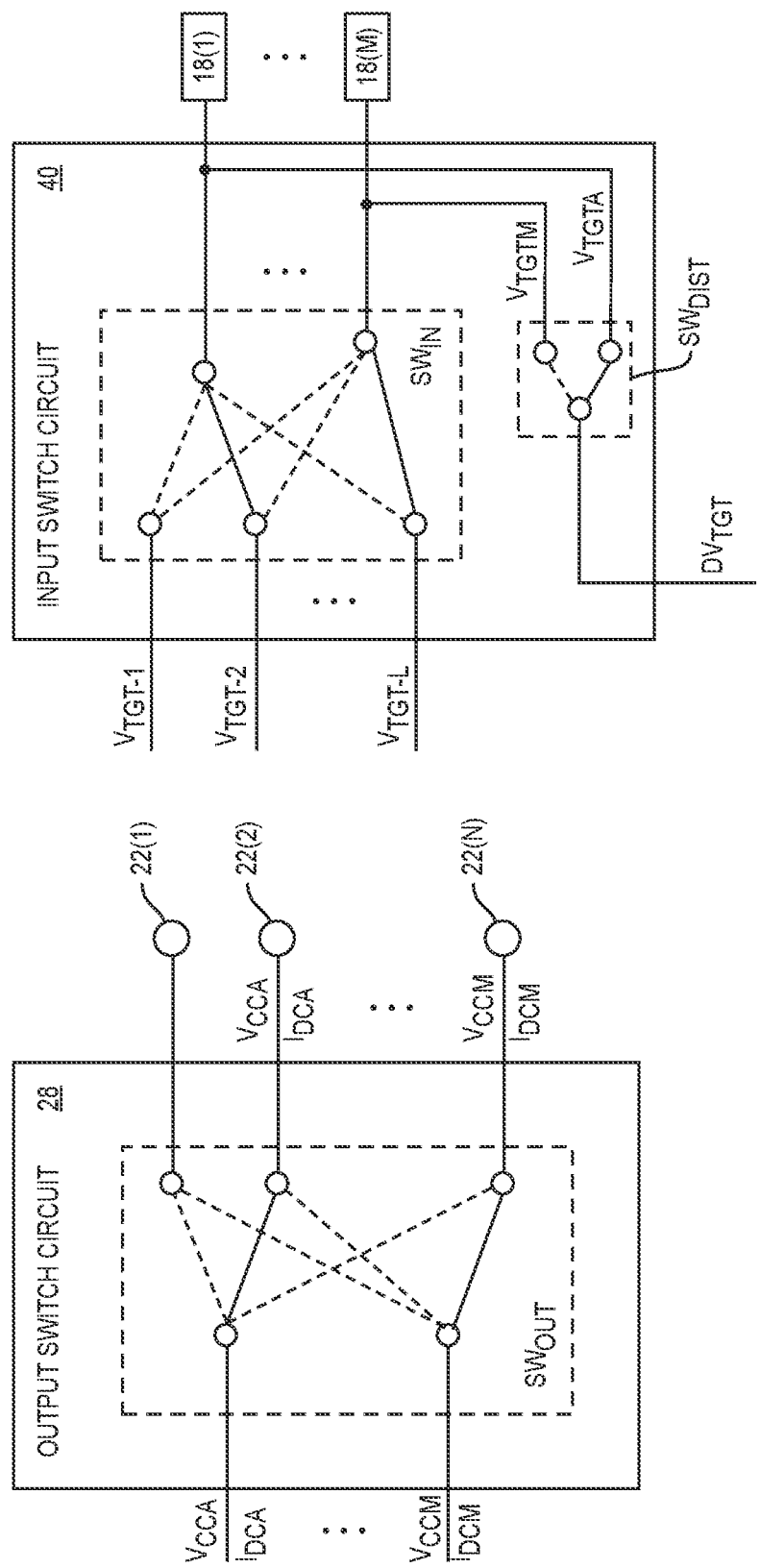
FIG. 2A is a schematic diagram providing an exemplary illustration of an output switch circuit in an envelope tracking (ET) integrated circuit (ETIC) of the distributed power management apparatus of FIG. 1.
FIG. 2B is a schematic diagram providing an exemplary illustration of an input switch circuit in the ETIC of the distributed power management apparatus of FIG. 1.

FIG. 2A is a schematic diagram providing an exemplary illustration of the output switch circuit 28 in the ETIC 12 of the distributed power management apparatus 10 of FIG. 2. Common elements between FIGS. 1 and 2A are shown therein with common element numbers and will not be re-described herein.

Notably, the output switch circuit 28 can include one or more output switches $SW_{OUT}$, which can be any type of switches. For example, the output switches $SW_{OUT}$ can be a multi-pole multi-throw (MPMT) switch or a number of single-pole multi-throw (SPMT) switches. Accordingly, the control circuit 30 can control the output switches $SW_{OUT}$ to selectively couple any of the voltage circuits 18(1)-18(M) to any of the voltage outputs 22(1)-22(N).

With reference back to FIG. 1, the distributed power management apparatus 10 can include one or more power amplifier circuits 32(1)-32(K) (K<N), each configured to amplify a respective one of one or more radio frequency (RF) signals 34(1)-34(K). The control circuit 30 can control the output switch circuit 38 to provide any of the ET voltages $V_{CCA}$-$V_{CCM}$ and any of the low-frequency currents $I_{DCA}$-$I_{DCM}$ to any of the power amplifier circuits 32(1)-32(K). The distributed power management apparatus 10 also includes at least one distributed power amplifier circuit 36 configured to amplify at least one distributed RF signal 38. The distributed power amplifier circuit 36 is coupled to the distributed voltage output 26 to receive the distributed ET voltage $DV_{CC}$.

Since the distributed ETIC 14 is coupled to the ETIC 12 via the conductive trace 16, the distributed ETIC 14 will see a trace inductance $L_T$ and a capacitance $C_{VO}$. Herein, the trace inductance $L_T$ represents an equivalent inductance of the conductive trace 16 and the capacitance $C_{VO}$ represents an equivalent capacitance of all active and passive circuits that are coupled to the dedicated voltage output 24. For example, the capacitance $C_{VO}$ can include an equivalent capacitance of a switch (not shown) in the output switch circuit 38 that couples the selected one of the voltage circuits 18(1)-18(M) to the dedicated voltage output 24. In addition, if any of the power amplifier circuits 32(1)-32(K) is coupled to the dedicated voltage output 24, the capacitance $C_{VO}$ would also include an equivalent capacitance of the power amplifier circuit. Given that the equivalent capacitances of the switch and the power amplifier circuit are all parallel capacitances with respect to the dedicated voltage output 24, the capacitance $C_{VO}$ at the dedicated voltage output 24 will equal a sum of the equivalent capacitances of any switch and any power amplifier circuit coupled to the dedicated voltage output 24.

The trace inductance $L_T$ and the capacitance $C_{VO}$ can cause an equivalent series resonance frequency $f_{RESONANCE}$ as shown in the equation (Eq. 1) below.

$$f_{RESONANCE} = 1/(2\pi\sqrt{L_T * C_{OV}}) \qquad (Eq.\ 1)$$

The equivalent series resonance frequency $f_{RESONANCE}$ can cause linearity degradation in the distributed power amplifier circuit 36 if the equivalent series resonance frequency $f_{RESONANCE}$ is close enough to a modulation bandwidth of the distributed RF signal 38. In this regard, it is necessary to separate the equivalent series resonance frequency $f_{RESONANCE}$ from the modulation bandwidth as much as possible.

In an embodiment, it is possible to separate the equivalent series resonance frequency $f_{RESONANCE}$ from the modulation bandwidth of the distributed RF signal 38 by increasing the equivalent series resonance frequency $f_{RESONANCE}$. According to the equation (Eq. 1), one way to increase the equivalent series resonance frequency $f_{RESONANCE}$ is to reduce the capacitance $C_{VO}$. As mentioned above, the capacitance $C_{VO}$ is equal to the sum of equivalent capacitance of any switch and any power amplifier circuit coupled to the dedicated voltage output 24. In a non-limiting example, it is possible to reduce the capacitance $C_{VO}$ by eliminating the equivalent capacitance of any power amplifier circuit coupled to the dedicated voltage output 24. In this regard, the distributed power management apparatus 10 can be configured not to couple any of the power amplifier circuit 32(1)-32(K) to the dedicated voltage output 24. In other words, the power amplifier circuit 32(1)-32(K) can be coupled to any of the voltage outputs 22(1)-22(N), except for the dedicated voltage output 24.

The ETIC 12 also includes an input switch circuit 40. The input switch circuit 40 is coupled to a transceiver circuit (not shown) to receive the ET target voltages $V_{TGT-1}$-$V_{TGT-L}$. The input switch circuit 40 is also coupled to the voltage circuits 18(1)-18(M) in the ETIC 12 and the distributed voltage circuit 20 in the distributed ETIC 14.

FIG. 2B is a schematic diagram providing an exemplary illustration of the input switch circuit 40 in the ETIC 12 of the distributed power management apparatus 10 of FIG. 2. Common elements between FIGS. 1 and 2B are shown therein with common element numbers and will not be re-described herein.

Notably, the input switch circuit 40 can include one or more input switches $SW_{IN}$, which can be any type of switches. For example, the input switches $SW_{IN}$ can be an MPMT switch or a number of SPMT switches. Accordingly, the control circuit 30 can control the input switches $SW_{IN}$ to provide any of the ET target voltages $V_{TGT-1}$-$V_{TGT-L}$ to any of the voltage circuits 18(1)-19(M). The input switch circuit 40 also includes at least one distribution switch $SW_{DIST}$, which can be a multi-pole single throw (MPST) or a SPMT switch, as an example. The control circuit 30 can control the distribution switch $SW_{DIST}$ to provide any of the ET target voltages $V_{TGT-1}$-$V_{TGT-L}$ to the distributed voltage circuit 20 as the distributed ET target voltage $DV_{TGT}$.

Figures 3A, 3B:
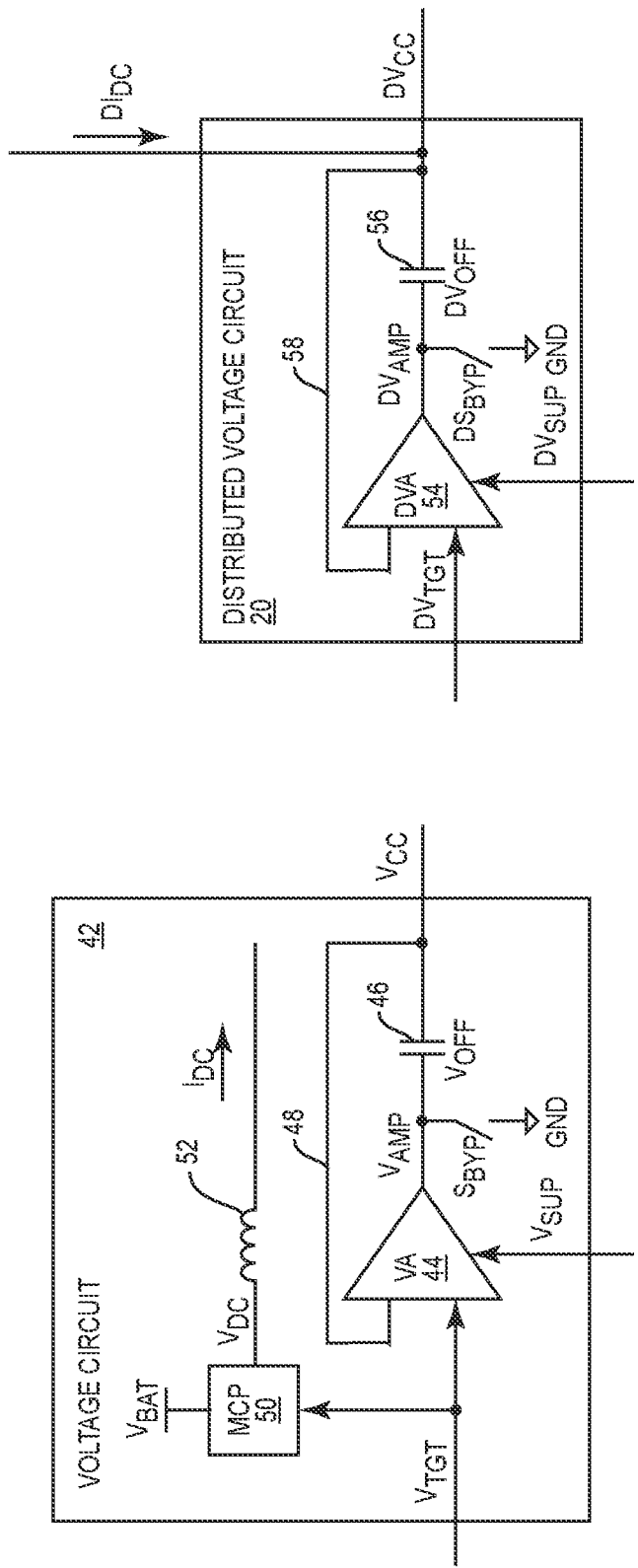
FIG. 3A is a schematic diagram providing an exemplary illustration of a voltage circuit in the ETIC of the distributed power management apparatus of FIG. 1.
FIG. 3B is a schematic diagram providing an exemplary illustration of a distributed voltage circuit in a distributed ETIC of the distributed power management apparatus of FIG. 1.

With reference back to FIG. 1, as discussed earlier, each of the voltage circuits 18(1)-18(M) in the ETIC 12 can generate the respective one of the ET voltages $V_{CCA}$-$V_{CCM}$ and the respective one of the low-frequency currents $I_{DCA}$-$I_{DCM}$. In this regard, FIG. 3A is a schematic diagram providing an exemplary illustration of a voltage circuit 42, which can be provided in the distributed power management apparatus 10 of FIG. 1 as any of the voltage circuits 18(1)-18(N). Common elements between FIGS. 1 and 3A are shown therein with common element numbers and will not be re-described herein.

The voltage circuit 42 includes a voltage amplifier 44 (denoted as "VA") coupled in series to an offset capacitor 46. The voltage amplifier 44 is configured to generate an initial ET voltage $V_{AMP}$ based on an ET target voltage $V_{TGT}$, which can be any of the ET target voltages $V_{TGT-1}$-$V_{TGT-L}$. The offset capacitor 46 can be charged by a low-frequency current $I_{DC}$, which can be any of the low-frequency currents $I_{DCA}$-$I_{DCM}$, to an offset voltage $V_{OFF}$ to thereby raise the initial ET voltage $V_{AMP}$ by the offset voltage $V_{OFF}$. Accordingly, the voltage circuit 42 can generate an ET voltage $V_{CC}$, which can by any of the ET voltages $V_{CCA}$-$V_{CCM}$, that equals a sum of the initial ET voltage $V_{AMP}$ and the offset voltage $V_{OFF}$ ($V_{CC}$=$V_{AMP}$+$V_{OFF}$).

The voltage circuit 42 also includes a bypass switch SBYP having one end coupled in between the voltage amplifier 44 and the offset capacitor 46, and another end to a ground (GND). The bypass switch SBYP is closed while the offset capacitor 46 is being charged toward the offset voltage $V_{OFF}$ and opened when the offset capacitor 46 is charged to the offset voltage $V_{OFF}$. The voltage circuit 42 also includes a feedback loop 48 that feeds a copy of the ET voltage $V_{CC}$ back to the voltage amplifier 44. The voltage amplifier 44 operates based on a supply voltage $V_{SUP}$, which may be provided by, for example, the control circuit 30 in the ETIC 12. Notably, the supply voltage $V_{SUP}$ may also be provided by a dedicated supply voltage circuit (not shown) in the ETIC 12.

The voltage circuit 42 also includes a multi-level charge pump (MCP) 50 coupled in series to a power inductor 52. The MCP 50 is configured to generate the low-frequency voltage $V_{DC}$ at multiple levels based on a battery voltage $V_{BAT}$. In a non-limiting example, the MCP 50 can generate the low-frequency voltage at different levels (e.g., 0 V, $V_{BAT}$, or 2*$V_{BAT}$) in accordance with the ET target voltage $V_{TGT}$. The power inductor 52 induces the low-frequency current $I_{DC}$ based on the low-frequency voltage $V_{DC}$.

With reference back to FIG. 1, as discussed earlier, the distributed voltage circuit 20 in the distributed ETIC 14 can generate the distributed ET voltage $DV_{CC}$ based on the distributed ET target voltage $DV_{TGT}$. In this regard, FIG. 3B is a schematic diagram providing an exemplary illustration of the distributed voltage circuit 20 in the distributed power management apparatus 10 of FIG. 1. Common elements between FIGS. 1 and 3B are shown therein with common element numbers and will not be re-described herein.

The distributed voltage circuit 20 includes a distributed voltage amplifier 54 (denoted as "DVA") coupled in series to a distributed offset capacitor 56. The distributed voltage amplifier 54 is configured to generate a distributed initial ET voltage $DV_{AMP}$ based on the distributed ET target voltage $DV_{TGT}$, which can be any of the ET target voltages $V_{TGT-1}$-$V_{TGT-L}$. The distributed offset capacitor 56 can be charged by the selected low-frequency current $DI_{DC}$, which can be any of the low-frequency currents $I_{DCA}$-$I_{DCM}$, to a distributed offset voltage $DV_{OFF}$ to thereby raise the distributed initial ET voltage $DV_{AMP}$ by the distributed offset voltage $DV_{OFF}$. Accordingly, the distributed voltage circuit 20 can generate the distributed ET voltage $DV_{CC}$ that equals a sum of the distributed initial ET voltage $DV_{AMP}$ and the distributed offset voltage $DV_{OFF}$ ($DV_{CC}$=$DV_{AMP}$+$DV_{OFF}$).

The distributed voltage circuit 20 also includes a distributed bypass switch $DS_{BYP}$ having one end coupled in between the distributed voltage amplifier 54 and the distributed offset capacitor 56, and another end to the GND. The distributed bypass switch $DS_{BYP}$ is closed while the distributed offset capacitor 56 is being charged toward the distributed offset voltage $DV_{OFF}$ and opened when the distributed offset capacitor 56 is charged to the distributed offset voltage $DV_{OFF}$. The voltage circuit 42 also includes a distributed feedback loop 58 that feeds a copy of the distributed ET voltage $DV_{CC}$ back to the distributed voltage amplifier 54. The distributed voltage amplifier 54 operates based on a distributed supply voltage $DV_{SUP}$, which may be provided by, for example, the control circuit 30 in the ETIC 12. Notably, the distributed supply voltage $DV_{SUP}$ may also be provided by a dedicated supply voltage circuit (not shown) in the ETIC 12 or in the distributed ETIC 14.

In contrast to the voltage circuit 42 in FIG. 3A, the distributed voltage circuit 20 does not include the MCP 50 and the power inductor 52. Instead, the distributed voltage circuit 20 relies on the MCP 50 and the power inductor 52 in the voltage circuit 42 of FIG. 3A to supply the selected low-frequency current $DI_{DC}$. By eliminating the MCP 50 and the power inductor 52 from the distributed voltage circuit 20, it is thus possible to reduce footprint of the distributed voltage circuit 20.

With reference back to FIG. 1, when the selected one of the voltage circuits 18(1)-18(M) is coupled to the dedicated voltage output 24 to provide the selected low-frequency current $DI_{DC}$ to the distributed voltage circuit 20, the control circuit 30 can deactivate the voltage amplifier 44 in the selected one of the voltage circuits 18(1)-18(M). The control circuit 30 can further control the distribution switch $SW_{DIST}$ in the input switch circuit 40 to provide the respective one of the ET target voltages $V_{TGT-1}$-$V_{TGT-L}$ received by the selected one of the voltage circuits 18(1)-18(M) to the distributed voltage circuit 20 in the distributed ETIC 14. For example, if the voltage circuit 18(1) has been coupled to the dedicated voltage output 24 and is configured to receive the ET target voltage $V_{TGT-1}$, the control circuit 30 would deactivate the voltage amplifier 44 in the voltage circuit 18(1) and control the distribution switch $SW_{DIST}$ to provide the ET target voltage $V_{TGT-1}$ to the distributed voltage circuit 20 as the distributed ET target voltage $DV_{TGT}$.

Figure 4:
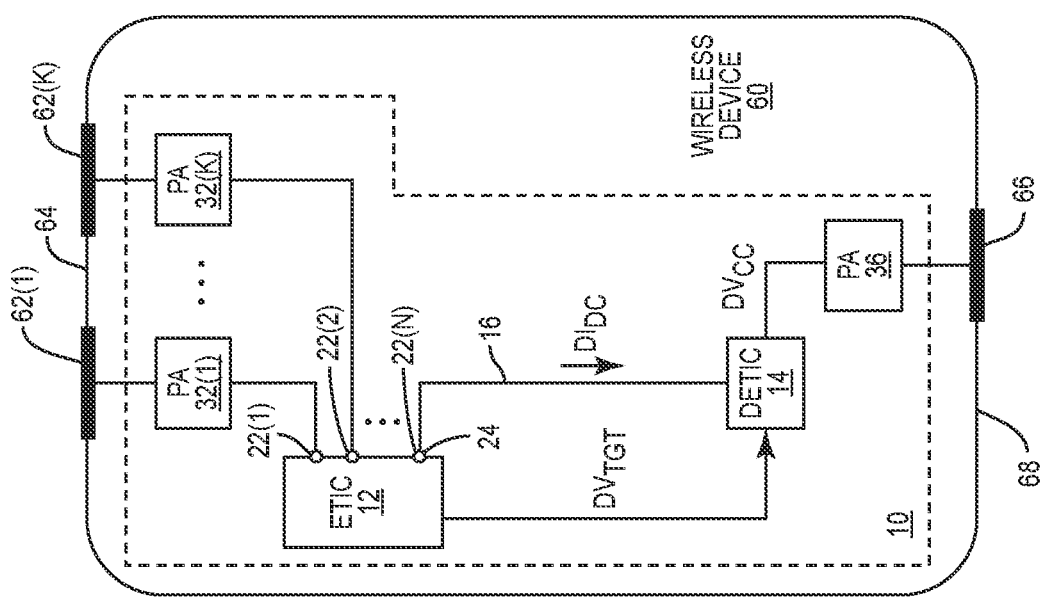
FIG. 4 is a schematic diagram of a wireless device incorporating the distributed power management apparatus of FIG. 1.

The distributed power management apparatus 10 can be provided in a wireless device to enable a flexible antenna configuration. In this regard, FIG. 4 is a schematic diagram of a wireless device 60 incorporating the distributed power management apparatus 10 of FIG. 1. Common elements between FIGS. 1 and 4 are shown therein with common element numbers and will not be re-described herein.

The wireless device 60 can include one or more antennas 62(1)-62(K) disposed on a first side 64 (e.g., top side) of the wireless device 60. As such, the power amplifier circuits 32(1)-32(K) can each be coupled to a respective one of the antennas 62(1)-62(K).

The wireless device 60 also includes at least one distributed antenna 66 disposed on a second side 68 (e.g., bottom side) of the wireless device 60. As shown in FIG. 4, the second side 68 is an opposite side relative to the first side 64. By disposing the antennas 64 and the distributed antenna 66 on the opposite sides, it is possible to mitigate a so-called hand-blocking effect. Accordingly, the distributed power amplifier circuit 36 can be coupled to the distributed antenna 66.

In embodiments disclosed herein, the ETIC 12 is disposed closer to any of the power amplifier circuits 32(1)-32(K) than to the distributed power amplifier circuit 36. Similarly, the distributed ETIC 14 is disposed closer to the distributed power amplifier circuit 36 than to any of the power amplifier circuits 32(1)-32(K). As a result, it is possible to reduce potential trace inductance distortion in the ET voltages $V_{CCA}$-$V_{CCM}$ and the distributed ET voltage $DV_{CC}$.

Those skilled in the art will recognize improvements and modifications to the preferred embodiments of the present disclosure. All such improvements and modifications are considered within the scope of the concepts disclosed herein and the claims that follow.

What is claimed is:

1. A distributed power management apparatus comprising:
    a distributed envelope tracking (ET) integrated circuit (ETIC) comprising a distributed voltage circuit configured to generate a distributed ET voltage based on a distributed ET target voltage; and
    an ETIC separated from the distributed ETIC and comprising:
        a plurality of voltage circuits each configured to generate a respective one of a plurality of ET voltages and a respective one of a plurality of low-frequency currents based on a respective one of a plurality of ET target voltages; and
        a control circuit configured to:
            couple a selected one of the plurality of voltage circuits to the distributed ETIC to provide the respective one of the plurality of low-frequency currents to the distributed ETIC; and
            cause a selected one of the plurality of ET target voltages to be provided to the distributed ETIC as the distributed ET target voltage.

2. The distributed power management apparatus of claim 1, wherein the distributed ETIC comprises:
    a distributed voltage amplifier configured to generate a distributed initial ET voltage based on the distributed ET target voltage; and
    a distributed offset capacitor configured to raise the distributed initial ET voltage by a distributed offset voltage to generate the distributed ET voltage.

3. The distributed power management apparatus of claim 1, wherein the plurality of voltage circuits each comprises:
    a multi-level charge pump (MCP) configured to generate a low-frequency voltage based on a battery voltage;
    a power inductor configured to induce a respective one of the plurality of low-frequency currents based on the low-frequency voltage;
    a voltage amplifier configured to generate an initial ET voltage based on the respective one of the plurality of ET target voltages; and
    an offset capacitor configured to raise the initial ET voltage by an offset voltage to generate the respective one of the plurality of ET voltages.

4. The distributed power management apparatus of claim 3, wherein the control circuit is further configured to cause the MCP in the selected one of the plurality of voltage circuits to generate the low-frequency voltage based on the selected one of the plurality of ET target voltages.

5. The distributed power management apparatus of claim 4, wherein the control circuit is further configured to deactivate the voltage amplifier in the selected one of the plurality of voltage circuits.

6. The distributed power management apparatus of claim 1, wherein:
    the ETIC further comprises an input switch circuit coupled to the distributed ETIC and the plurality of voltage circuits and configured to receive the plurality of ET target voltages from a transceiver circuit; and
    the control circuit is further configured to control the input switch circuit to couple any of the plurality of ET target voltages to any of the plurality of voltage circuits.

7. The distributed power management apparatus of claim 6, wherein the control circuit is further configured to control the input switch circuit to cause the selected one of the plurality of ET target voltages to be provided to the distributed ETIC and the selected one of the plurality of voltage circuits.

8. The distributed power management apparatus of claim 1, wherein:
    the ETIC further comprises an output switch circuit coupled between the plurality of voltage circuits and a plurality of voltage outputs; and
    the control circuit is further configured to control the output switch circuit to couple any of the plurality of voltage circuits to any of the plurality of voltage outputs.

9. The distributed power management apparatus of claim 8, wherein:
    the distributed ETIC is coupled to the ETIC via a selected one of the plurality of voltage outputs; and
    the control circuit is further configured to control the output switch circuit to couple the selected one of the plurality of voltage circuits to the selected one of the plurality of voltage outputs to provide the respective one of the plurality of low-frequency currents to the distributed ETIC.

10. The distributed power management apparatus of claim 9, further comprising:
    one or more power amplifier circuits each coupled to a respective one of the plurality of voltage outputs, wherein the respective one of the plurality of voltage outputs is different from the selected one of the plurality of voltage outputs that is coupled to the distributed ETIC; and
    at least one distributed power amplifier circuit coupled to the distributed ETIC.

11. A wireless device comprising:
    a distributed power management apparatus comprising:
        a distributed envelope tracking (ET) integrated circuit (ETIC) comprising a distributed voltage circuit configured to generate a distributed ET voltage based on a distributed ET target voltage; and
        an ETIC separated from the distributed ETIC and comprising:
            a plurality of voltage circuits each configured to generate a respective one of a plurality of ET voltages and a respective one of a plurality of low-frequency currents based on a respective one of a plurality of ET target voltages; and
            a control circuit configured to:
                couple a selected one of the plurality of voltage circuits to the distributed ETIC to provide the respective one of the plurality of low-frequency currents to the distributed ETIC; and cause a selected one of the plurality of ET target voltages to be provided to the distributed ETIC as the distributed ET target voltage;

one or more power amplifier circuits coupled to the ETIC; and at least one distributed power amplifier circuit coupled to the distributed ETIC.

12. The wireless device of claim 11, further comprising:

one or more antennas disposed along one side of the wireless device and each coupled to a respective one of the one or more power amplifier circuits; and at least one distributed antenna disposed along an opposite side of the wireless device and coupled to the at least one distributed power amplifier circuit.

13. The wireless device of claim 11, wherein:

the ETIC is disposed closer to any of the one or more power amplifier circuits than to the at least one distributed power amplifier circuit; and the distributed ETIC is disposed closer to the at least one distributed power amplifier circuit than to any of the one or more power amplifier circuits.

14. The wireless device of claim 11, wherein the distributed ETIC comprises:

a distributed voltage amplifier configured to generate a distributed initial ET voltage based on the distributed ET target voltage; and a distributed offset capacitor configured to raise the distributed initial ET voltage by a distributed offset voltage to generate the distributed ET voltage.

15. The wireless device of claim 11, wherein the plurality of voltage circuits each comprises:

a multi-level charge pump (MCP) configured to generate a low-frequency voltage based on a battery voltage;

a power inductor configured to induce a respective one of the plurality of low-frequency currents based on the low-frequency voltage;

a voltage amplifier configured to generate an initial ET voltage based on the respective one of the plurality of ET target voltages; and an offset capacitor configured to raise the initial ET voltage by an offset voltage to generate the respective one of the plurality of ET voltages.

16. The wireless device of claim 15, wherein the control circuit is further configured to:

cause the MCP in the selected one of the plurality of voltage circuits to generate the low-frequency voltage based on the selected one of the plurality of ET target voltages; and deactivate the voltage amplifier in the selected one of the plurality of voltage circuits.

17. The wireless device of claim 11, wherein:

the ETIC further comprises an input switch circuit coupled to the distributed ETIC and the plurality of voltage circuits and configured to receive the plurality of ET target voltages from a transceiver circuit; and the control circuit is further configured to control the input switch circuit to couple any of the plurality of ET target voltages to any of the plurality of voltage circuits.

18. The wireless device of claim 17, wherein the control circuit is further configured to control the input switch circuit to cause the selected one of the plurality of ET target voltages to be provided to the distributed ETIC and the selected one of the plurality of voltage circuits.

19. The wireless device of claim 11, wherein:

the ETIC further comprises an output switch circuit coupled between the plurality of voltage circuits and a plurality of voltage outputs; and the control circuit is further configured to control the output switch circuit to couple any of the plurality of voltage circuits to any of the plurality of voltage outputs.

20. The wireless device of claim 19, wherein:

the distributed ETIC is coupled to the ETIC via a selected one of the plurality of voltage outputs; and the control circuit is further configured to control the output switch circuit to couple the selected one of the plurality of voltage circuits to the selected one of the plurality of voltage outputs to provide the respective one of the plurality of low-frequency currents to the distributed ETIC.

* * * * *